(12) United States Patent
Jung

(10) Patent No.: US 8,759,189 B2
(45) Date of Patent: Jun. 24, 2014

(54) REPROCESSING METHOD OF A SEMICONDUCTOR DEVICE

(75) Inventor: Jin-San Jung, Asan-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 13/602,573

(22) Filed: Sep. 4, 2012

(65) Prior Publication Data

US 2013/0178040 A1  Jul. 11, 2013

(30) Foreign Application Priority Data

Jan. 11, 2012  (KR) .................. 10-2012-0003503

(51) Int. Cl.
 *H01L 21/20* (2006.01)
(52) U.S. Cl.
 USPC ........... 438/382; 438/384; 438/385; 257/524; 257/528; 257/529

(58) Field of Classification Search
 CPC ............ H01L 27/0629; H01L 27/0635; H01L 27/067; H01L 27/0711; H01L 27/0802
 See application file for complete search history.

(56) References Cited

U.S. PATENT DOCUMENTS

| | | | |
|---|---|---|---|
| 2008/0115886 A1 | 5/2008 | Miyamoto | |
| 2010/0225439 A1* | 9/2010 | Han et al. | 338/309 |
| 2011/0011636 A1* | 1/2011 | Oh et al. | 174/260 |

\* cited by examiner

*Primary Examiner* — Kyoung Lee
(74) *Attorney, Agent, or Firm* — F. Chau & Associates, LLC

(57) ABSTRACT

A reprocessing method of a semiconductor device, the reprocessing method includes adjusting a resistance value of a first resistor by first trimming the first resistor, wherein the first resistor is electrically connected between a first pad and a second pad, forming a second resistor on the first trimmed first resistor, and adjusting a resistance value of the second resistor by second trimming the second resistor.

18 Claims, 6 Drawing Sheets

REPROCESSING METHOD OF A SEMICONDUCTOR DEVICE

CROSS-REFERENCE TO RELATED APPLICATION

This application claims priority under 35 U.S.C. §119 to Korean Patent Application No. 10-2012-0003503 filed on Jan. 11, 2012 in the Korean Intellectual Property Office, the disclosure of which is incorporated by reference herein in its entirety.

BACKGROUND

1. Technical Field

The present inventive concept relates to a reprocessing method of a semiconductor device.

2. Discussion of the Related Art

As electronic products are becoming multi-functional, the number of integrated circuits (ICs) and passive components included therein is increasing. The ICs may be mounted on a surface of a circuit board, and the circuit board may include as many passive components needed to facilitate signal transmission between the ICs.

An embedded circuit board may include passive components such as a resistor (R), an inductor (L), or a capacitor (C), mounted in the circuit board. If separate passive components are mounted on the surface of the circuit board, the ability to achieve slim, lightweight electronic products is limited. Accordingly, there is an increasing tendency for using the embedded circuit board.

Attempts are being made at incorporating a film-type resistor into the embedded circuit board. For example, the film-type resistor is formed by sputtering and then laser trimmed to adjust a resistance value of the resistor to have a target resistance value. However, if the laser trimmed resistor has a resistance value different from the target resistance value, the resistance value of the laser trimmed resistor cannot be re-adjusted. Thus, an erroneously laser trimmed circuit board may be deemed defective and discarded.

SUMMARY

The present inventive concept provides a reprocessing method of a semiconductor device in which a resistance value of a laser trimmed resistor can be repeatedly adjusted.

According to an exemplary embodiment of the present inventive concept, there is provided a reprocessing method of a semiconductor device, the reprocessing method including adjusting a resistance value of a first resistor by first trimming the first resistor, wherein the first resistor is electrically connected between a first pad and a second pad, forming a second resistor on the first trimmed first resistor, and adjusting a resistance value of the second resistor by second trimming the second resistor.

A sum of the resistance values of the first trimmed first resistor and the second trimmed second resistor has a target resistance value.

The first resistor includes a first material and the second resistor includes a second material different from the first material.

The first material includes a nickel chrome alloy and the second material includes carbon paste.

The first resistor is a thin film resistor and the second resistor is a thick film resistor.

The first resistor is formed by sputtering.

The forming of the second resistor comprises printing carbon paste on the first trimmed first resistor.

The reprocessing method further comprises forming a third pad electrically connected to the first pad, and a fourth pad electrically connected to the second pad.

The reprocessing method further comprises forming a third resistor electrically connected between the third pad and the fourth pad, wherein the third resistor has a resistance value.

A sum of the resistance value of the first trimmed first resistor, the resistance value of the second trimmed second resistor and a resistance value of the third resistor has a target resistance value.

The reprocessing method further comprises adjusting the resistance value of the third resistor by third trimming the third resistor.

A sum of the resistance values of the first trimmed first resistor, the second trimmed second resistor and the third trimmed third resistor has a target resistance value.

The first pad and the third pad are formed on different layers and the second pad and the fourth pad are formed on different layers.

The third pad and the fourth pad are formed on the topmost layer.

The first resistor and second resistor are embedded in a circuit board.

According to an exemplary embodiment of the present inventive concept, there is provided a reprocessing method of a semiconductor device, the reprocessing method including adjusting a resistance value of a first resistor by first trimming the first resistor, wherein the first resistor is electrically connected between a first pad and a second pad, and forming a second resistor electrically connected between a third pad and a fourth pad, wherein the third pad is electrically connected to the first pad and the fourth pad is electrically connected to the second pad.

A sum of the resistance value of the first trimmed first resistor and a resistance value of the second resistor has a target resistance value.

The reprocessing method further comprises second trimming the second resistor to adjust a resistance value of the second resistor, wherein a sum of the resistance values of the first trimmed first resistor and the second trimmed second resistor has a target resistance value.

According to an exemplary embodiment of the present inventive concept, there is provided a reprocessing method of a semiconductor device, the reprocessing method including laser trimming a thin film resistor included in an embedded printed circuit board; determining that the laser trimmed resistor does not have a target resistance value; and printing a thick film resistor on the laser trimmed resistor to obtain the target resistance value.

The thick film resistor includes carbon paste.

BRIEF DESCRIPTION OF THE DRAWINGS

The above and other features of the present inventive concept will become more apparent by describing in detail exemplary embodiments thereof with reference to the attached drawings in which.

DETAILED DESCRIPTION OF THE EMBODIMENTS

Exemplary embodiments of the present inventive concept will be described more fully hereinafter with reference to the accompanying drawings. This inventive concept may, however, be embodied in different forms and should not be construed as limited to the embodiments set forth herein.

It will be understood that when an element or layer is referred to as being "connected to," or "coupled to" another element or layer, it can be directly connected to or coupled to the another element or layer or intervening elements or layers may be present. Like numbers may refer to like elements or layers throughout the drawings and specification.

The use of the terms "a," "an" and "the" are intended to include the plural forms as well, unless the context clearly indicates otherwise.

The semiconductor device to be described below may be an embedded circuit board incorporating a resistor, but it is not limited thereto. In addition, the semiconductor device may be a multi-layered circuit board having multiple wiring layers, but it is not limited thereto.

Figure 1:
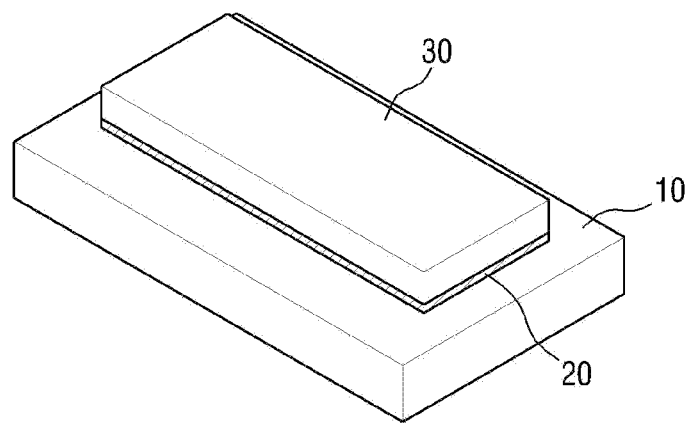
FIGS. 1 to 7 illustrate a reprocessing method of a semiconductor device according to an exemplary embodiment of the present inventive concept.
Figure 2:
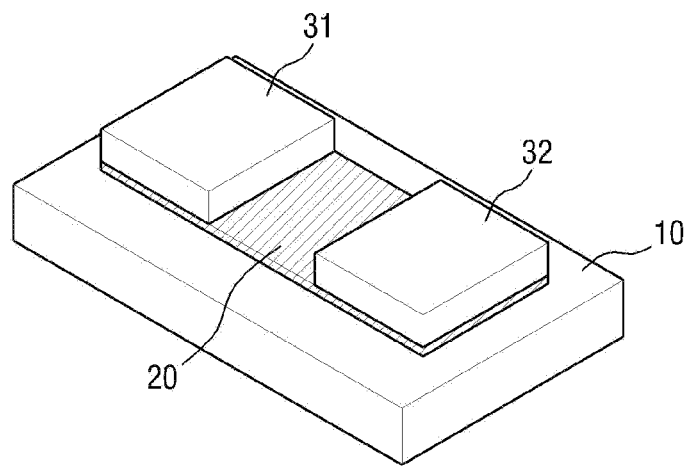
Figure 3:
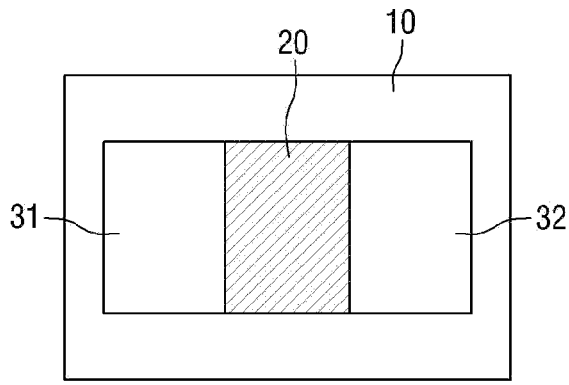
Figure 5:
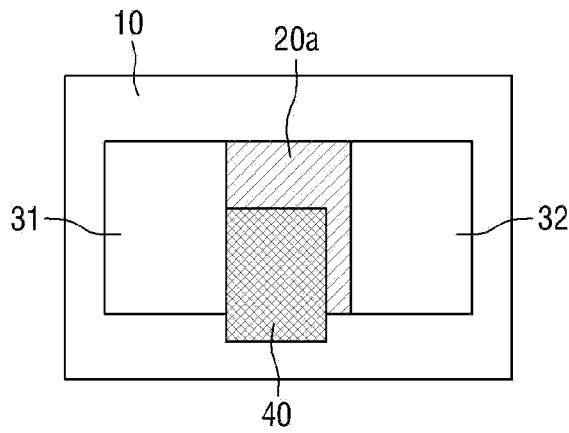
Figure 6:
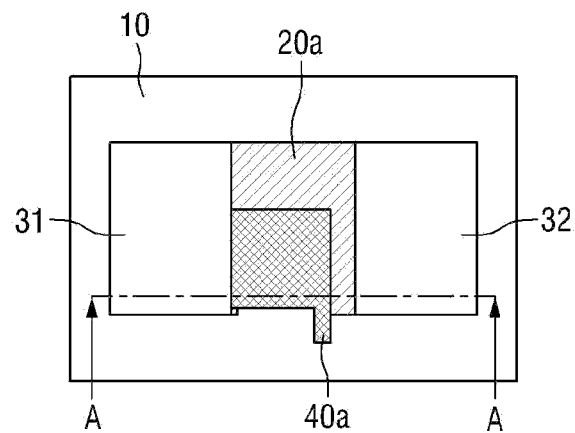
Figure 7:
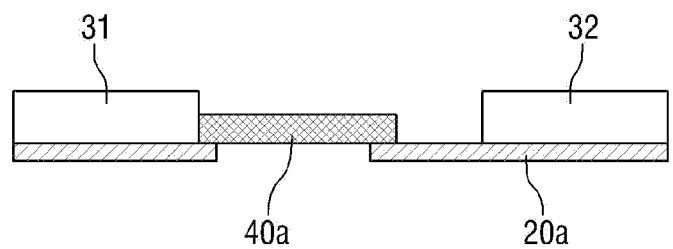

FIGS. 1 to 7 illustrate a reprocessing method of a semiconductor device according to an exemplary embodiment of the present inventive concept. Here, FIG. 3 is a plan view of FIG. 2 and FIG. 7 is a cross-sectional view taken along line A-A of FIG. 6.

First, referring to FIG. 1, a first resistor 20 and a pad forming conductive layer 30 are sequentially formed on a lower layer 10.

Here, the lower layer 10 may include an insulating material, for example, a resin, specifically, a resin capable of stably holding a resistive material having excellent flatness. The resin may include an epoxy resin, but it is not limited thereto.

The first resistor 20 may include a first material. For example, the first material may be a nickel chrome (NiCr) alloy, but it is not limited thereto. The first resistor 20 may be formed by sputtering, but it is not limited thereto.

The first resistor 20 may be a thin film resistor. For example, the first resistor 20 may have a thickness of about 2 μm to about 3 μm, but it is not limited thereto.

For example, the pad forming conductive layer 30 may be made of copper, but it is not limited thereto. As shown, the pad forming conductive layer 30 may be thicker than the first resistor 20.

Referring to FIGS. 2 and 3, a portion of the pad forming conductive layer 30 is removed, thereby forming a first pad 31 and a second pad 32 spaced apart from each other.

The forming of the first pad 31 and the second pad 32 may be performed by, for example, wet etching. The wet etching may be performed using an etching solution capable of selectively etching only the pad forming conductive layer 30 without etching the first resistor 20.

Figure 4:
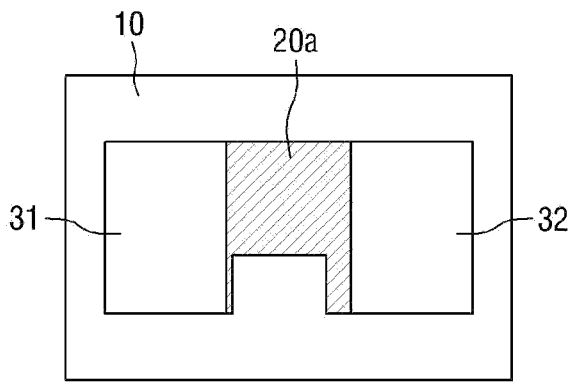

Referring to FIG. 4, the first resistor 20 is first trimmed to adjust a resistance value of the first resistor 20.

In detail, the resistance value of the first resistor 20 that is not yet trimmed may be, for example, R1Ω. If a target resistance value of the first resistor 20 is R2Ω, the resistance value of the first resistor 20 should be changed. Here, the target resistance value may be a particular value (R2Ω), but may be in a particular range of R2a Ω to R2b Ω. To change the resistance value of the first resistor 20, a first trimming process is performed to remove a portion of the first resistor 20. The first trimming process may be performed by, for example, laser trimming (e.g., with a yttrium aluminum garnet (YAG) laser), but it is not limited thereto. The resistance value of the first resistor 20 with the portion removed is determined by measuring varying resistance values of the first resistor 20 by applying a bias voltage to the first pad 31 and the second pad 32.

If the first resistor 20 has a target resistance value of R2Ω through the first trimming process, the following processes (the processes shown in FIGS. 5 to 7) may not be performed.

However, if too much of the first resistor 20 is removed during the first trimming process (in other words, if the first resistor 20 has a resistance value of R3Ω, rather than R2Ω), the following processes (the processes shown in FIGS. 5 to 7) may be performed.

Referring to FIG. 5, a second resistor 40 is formed on the first trimmed first resistor 20a.

In detail, the second resistor 40 may include a second material different from the first material. The second material may be a material having higher processability than the first material. For example, the second material may include carbon paste. The forming of the second resistor 40 may include printing carbon paste on the first trimmed first resistor 20a and curing the printed carbon past. The second resistor 40 may be formed to make contact with the first resistor 20.

The second resistor 40 may be a thick film resistor. The second resistor 40 may be thicker than the first trimmed first resistor 20a.

As shown, the second resistor 40 may be formed on only a portion of the first trimmed first resistor 20a or may be formed to entirely cover the first trimmed first resistor 20a.

Referring to FIGS. 6 and 7, the second resistor 40 is second trimmed to adjust a resistance value of the second resistor 40.

In detail, the second resistor 40 is second trimmed to adjust a sum of the resistance values of the first trimmed first resistor 20a and the second trimmed second resistor 40a to have a target resistance value of R2Ω. Since the second material (e.g., carbon paste) of the second resistor 40 has high processibility, it is easy to adjust the sum of the resistance values of the first trimmed first resistor 20a and the second trimmed second resistor 40a to have a target resistance value of R2 Ω.

Here, equipment used in the second trimming process may be the same as that used in the first trimming process. For example, laser trimming (e.g., with a YAG laser) may be used in the second trimming process, but it is not limited thereto.

In the reprocessing method of a semiconductor device according to an exemplary embodiment of the present inventive concept, even if the resistance value of the first trimmed first resistor 20a is not adjusted to the target resistance value, the first trimmed first resistor 20a can be reprocessed. In other words, the second resistor 40 having high processibility is formed on the first trimmed first resistor 20a and the second resistor 40 is then second trimmed, to thereby make a sum of the resistance values of the first trimmed first resistor 20a and the second trimmed second resistor 40a have the target resistance value. Therefore, a failure rate of the semiconductor device can be minimized.

Figure 8:
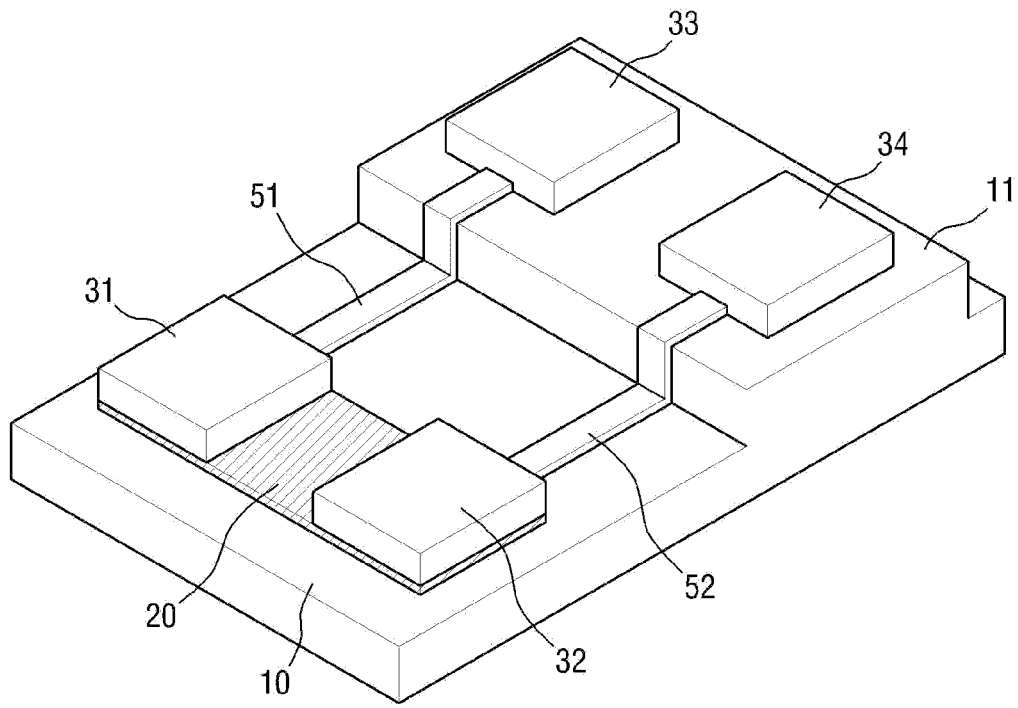
FIGS. 8 and 9 illustrate a reprocessing method of a semiconductor device according to an exemplary embodiment of the present inventive concept.
Figure 9:
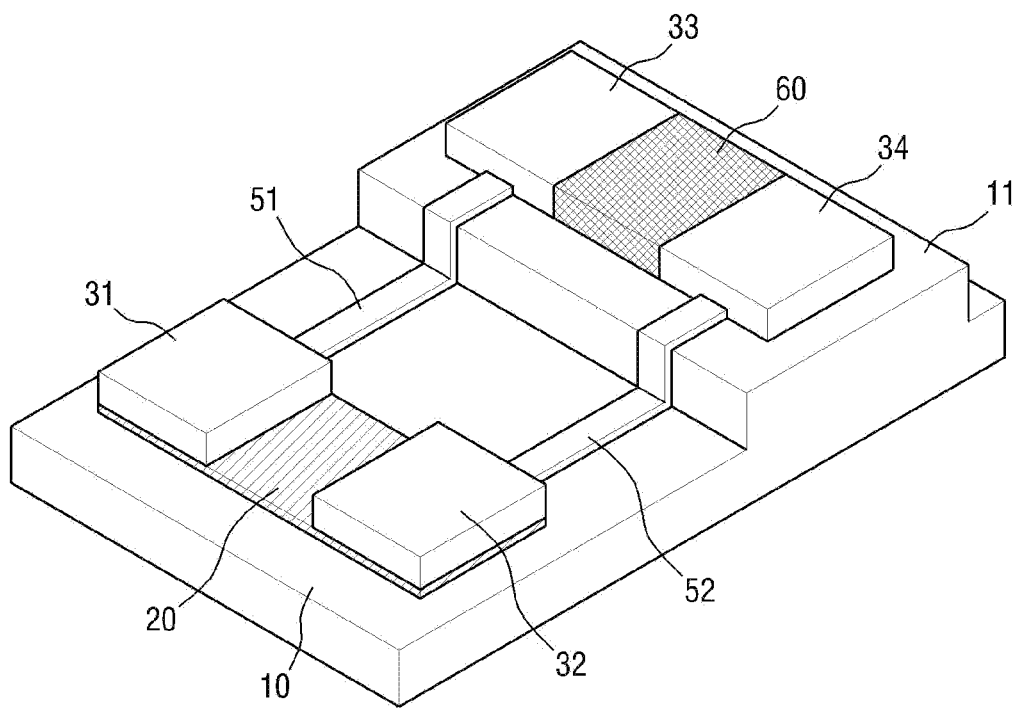

FIGS. 8 and 9 illustrate a reprocessing method of a semiconductor device according to an exemplary embodiment of the present inventive concept. For brevity, the following description will focus on differences between the reprocessing methods according to the present exemplary embodiment and the previous exemplary embodiment shown in FIGS. 1 to 7.

Referring to FIG. 8, a first resistor 20, a first pad 31, a second pad 32, a third pad 33 and a fourth pad 34 may be formed on lower layers 10 and 11.

As shown in FIG. 8, the lower layers 10 and 11 may include a first lower layer 10 and a second lower layer 11. The second lower layer 11 may be formed on the first lower layer 10.

The first pad 31 and the third pad 33 may be formed on different layers, and the second pad 32 and the fourth pad 34 may be formed on different layers. The first pad 31 and the second pad 32 may be formed on the first lower layer 10 and the third pad 33 and the fourth pad 34 may be formed on the second lower layer 11. As shown, the third pad 33 and the fourth pad 34 may be formed on a higher layer than the first pad 31 and the second pad 32. The third pad 33 and the fourth pad 34 may be formed on the topmost layer, but they are not limited thereto. In other words, assuming that a semiconductor device (e.g., a circuit board) has a total of 10 wiring layers, the third pad 33 and the fourth pad 34 may be positioned on the 10th layer.

The first pad 31 and the third pad 33 may be electrically connected to each other using a first wiring 51 and the second pad 32 and the fourth pad 34 may be electrically connected to each other using a second wiring 52, but they are not limited thereto.

The electrically connected first resistor 20 may be formed between the first pad 31 and the second pad 32. The first resistor 20 may include a first material, for example, a nickel chrome (NiCr) alloy. The first resistor 20 may be formed by sputtering. The first resistor 20 may be a thin film resistor. Here, if the resistance value of the first resistor 20 has a target resistance value of R2Ω, the process shown in FIG. 9 may not be performed. However, if the first resistor 20 has a resistance value different from the target resistance value R2Ω, the process shown in FIG. 9 is performed.

Referring to FIG. 9, an electrically connected third resistor 60 may be formed between the third pad 33 and the fourth pad 34.

The third resistor 60 may include a second material different from the first material and have high processibility. The second material may be carbon paste. The third resistor 60 may be a thick film resistor.

If the electrically connected third resistor 60 is formed between the third pad 33 and the fourth pad 34, the first resistor 20 and the third resistor 60 are connected to each other in parallel.

By forming the third resistor 60 in such a manner, a sum of resistance values of the first resistor 20 and the third resistor 60 connected to each other in parallel may be adjusted to have the target resistance value R2 Ω.

Figure 10:
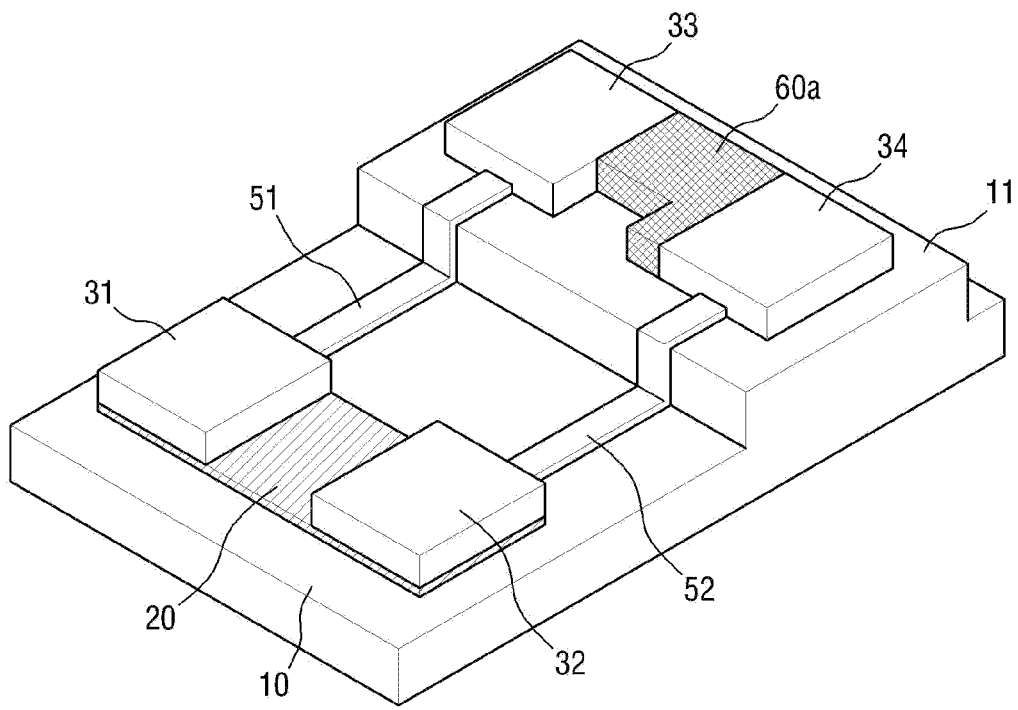
FIG. 10 illustrates a reprocessing method of a semiconductor device according to an exemplary embodiment of the present inventive concept.

FIG. 10 illustrates a reprocessing method of a semiconductor device according to an exemplary embodiment of the present inventive concept. For brevity, the following description will focus on differences between the reprocessing methods according to the present exemplary embodiment and the previous exemplary embodiment shown in FIGS. 8 and 9. In the structure shown in FIG. 9, if a sum of the resistance values of the first resistor 20 and the third resistor 60 connected to each other in parallel is not the target resistance value R2Ω, the process shown in FIG. 10 may be performed.

Referring to FIG. 10, the third resistor 60 is third trimmed to adjust the resistance value of the third resistor 60. In this way, a sum of the resistance values of the first resistor 20 and the third trimmed third resistor 60a may have the target resistance value R2Ω. Since the third resistor 60 is made of the second material having high processibility, it is easy to adjust the sum of the resistance values of the first resistor 20 and the third trimmed third resistor 60a to have the target resistance value R2 Ω.

In addition, as shown in FIGS. 8 to 10, if the third pad 33 and the fourth pad 34 are formed on layers higher than the first pad 31 and the second pad 32, the following features are demonstrated.

While manufacturing a multi-layered circuit board, the first resistor 20 may have resistance values that vary according to processing conditions. In other words, even if the first resistor 20 was initially adjusted to have a target resistance value, the resistance value of the first resistor 20 may be changed during later steps in the manufacture of the multi-layered circuit board. For example, while the first resistor 20, the first pad 31 and the second pad 32 are covered by a resin and then a higher level wiring is formed, the resistance value of the first resistor 20 may be changed. In this case, the resistance value of the first resistor 20 may be adjusted to have the target resistance value by forming the third resistor 60 between the third pad 33 and the fourth pad 34 positioned higher than the first pad 31 and the second pad 32.

In addition, although not shown, the first resistor 20 shown in FIG. 8 may be first trimmed and the first trimmed first resistor 20a, the first pad 31 and the second pad 32 are then covered by a resin. Thereafter, to adjust the resistance value to have a target resistance value, the third resistor 60 may be formed between the third pad 33 and the fourth pad 34.

Figure 11:
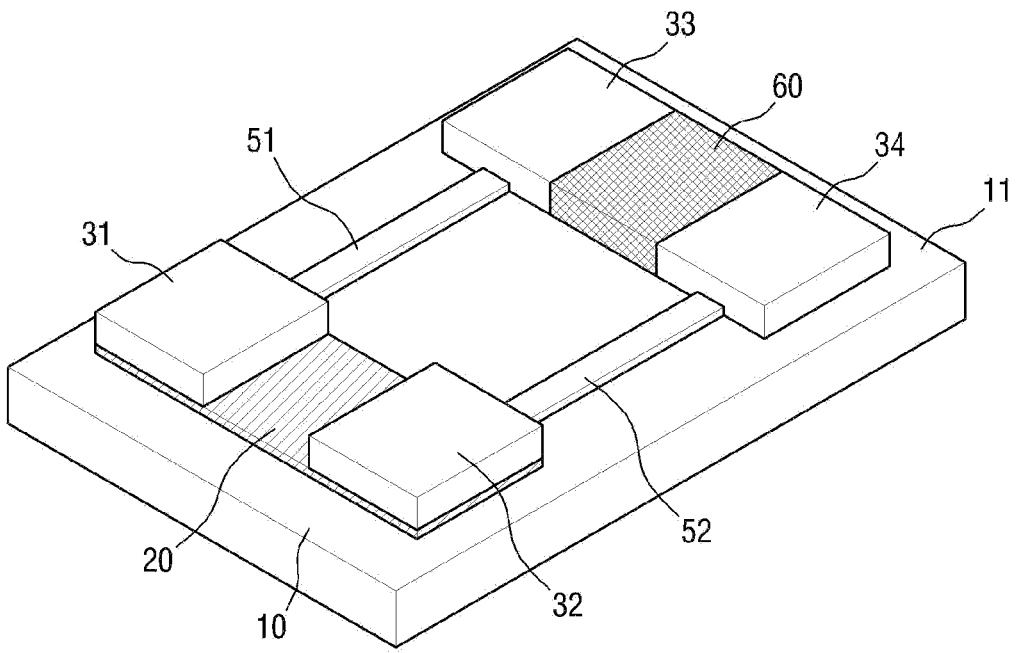
FIG. 11 illustrates a reprocessing method of a semiconductor device according to an exemplary embodiment of the present inventive concept.

FIG. 11 illustrates a reprocessing method of a semiconductor device according to an exemplary embodiment of the present inventive concept. For brevity, the following description will focus on differences between the reprocessing methods according to the present exemplary embodiment and the previous exemplary embodiment shown in FIG. 9.

The semiconductor device shown in FIG. 11 is different from that shown in FIG. 9 in that it has no second lower layer 11. In other words, a first pad 31 and a second pad 32 are formed on the same layer with a third pad 33 and a fourth pad 34.

Therefore, when a first resistor 20 is formed between the first pad 31 and the second pad 32 and the first resistor 20 has a resistance value other than a target resistance value, an electrically connected third resistor 60 may be formed between the third pad 33 and the fourth pad 34 to obtain the target resistance value.

Figure 12:
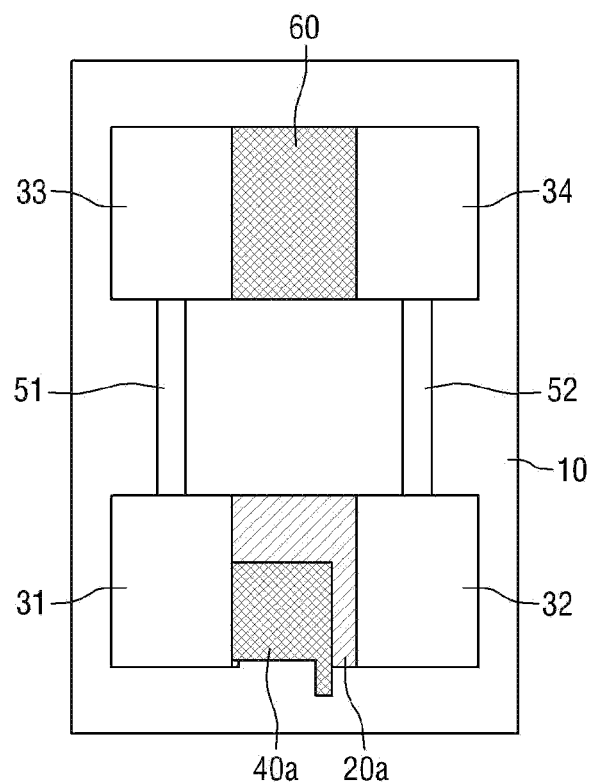
FIG. 12 illustrates a reprocessing method of a semiconductor device according to an exemplary embodiment of the present inventive concept.

FIG. 12 illustrates a reprocessing method of a semiconductor device according to an exemplary embodiment of the present inventive concept. For brevity, the following description will focus on differences between the reprocessing methods according to the present exemplary embodiment and the previous exemplary embodiment shown in FIG. 11.

Referring to FIG. 12, in the semiconductor device according to an exemplary embodiment of the present inventive concept, a first resistor 20, a second resistor 40 and a third resistor 60 may be formed to have a target resistance value.

In detail, the first resistor 20 is formed between a first pad 31 and a second pad 32 by sputtering. The first resistor 20 may be first trimmed to form a first trimmed resistor 20a.

If a resistance value of the first trimmed first resistor 20a is not a target resistance value, the second resistor 40 is formed on the first trimmed first resistor 20a by printing. The second resistor 40 may also be second trimmed to form a second trimmed resistor 40a.

If a sum of resistance values of the first trimmed first resistor 20a and the second trimmed second resistor 40a is not a target resistance value, the third resistor 60 is formed between the third pad 33 and the fourth pad 34 by printing.

Although not shown, if a sum of resistance values of the first trimmed first resistor 20a, the second trimmed second resistor 40a and the third resistor 60 is not a target resistance value, the third resistor 60 may be third trimmed to form a third trimmed resistor 60a.

In the reprocessing method according to the exemplary embodiment of the present inventive concept, as described above with reference to FIG. 12, multiple adjustments can be made to obtain a target resistance value, including first trimming the first resistor 20, second trimming the second resistor 40, and third trimming the third resistor 60. Therefore, an erroneously laser trimmed semiconductor device can be corrected several times, thereby reducing a failure rate of the semiconductor device.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims.

What is claimed is:

1. A reprocessing method of a semiconductor device, comprising:
    adjusting a resistance value of a first resistor by first trimming the first resistor, wherein the first resistor is electrically connected between a first pad and a second pad;
    forming a second resistor on the first trimmed first resistor; and
    adjusting a resistance value of the second resistor by second trimming the second resistor,
    wherein a sum of the resistance values of the first trimmed first resistor and the second trimmed second resistor has a target resistance value.

2. The reprocessing method of claim 1, wherein the first resistor includes a first material and the second resistor includes a second material different from the first material.

3. The reprocessing method of claim 2, wherein the first material includes a nickel chrome alloy and the second material includes carbon paste.

4. The reprocessing method of claim 1, wherein the first resistor is a thin film resistor and the second resistor is a thick film resistor.

5. The reprocessing method of claim 1, wherein the first resistor is formed by sputtering.

6. The reprocessing method of claim 1, wherein the forming of the second resistor comprises printing carbon paste on the first trimmed first resistor.

7. The reprocessing method of claim 1, further comprising forming a third pad electrically connected to the first pad, and a fourth pad electrically connected to the second pad.

8. The reprocessing method of claim 7, further comprising forming a third resistor electrically connected between the third pad and the fourth pad.

9. The reprocessing method of claim 8, wherein a sum of the resistance value of the first trimmed first resistor, the resistance value of the second trimmed second resistor and a resistance value of the third resistor has a target resistance value.

10. The reprocessing method of claim 8, further comprising adjusting the resistance value of the third resistor by third trimming the third resistor.

11. The reprocessing method of claim 10, wherein a sum of the resistance values of the first trimmed first resistor, the second trimmed second resistor and the third trimmed third resistor has a target resistance value.

12. The reprocessing method of claim 7, wherein the first pad and the third pad are formed on different layers and the second pad and the fourth pad are formed on different layers.

13. The reprocessing method of claim 12, wherein the third pad and the fourth pad are formed on the topmost layer.

14. The reprocessing method of claim 1, wherein the first resistor and second resistor are embedded in a circuit board.

15. A reprocessing method of a semiconductor device, comprising:
    adjusting a resistance value of a first resistor by first trimming the first resistor, wherein the first resistor is electrically connected between a first pad and a second pad;
    forming a second resistor electrically connected between a third pad and a fourth pad, wherein the third pad is electrically connected to the first pad and the fourth pad is electrically connected to the second pad; and
    second trimming the second resistor to adjust a resistance value of the second resistor, wherein a sum of the resistance values of the first trimmed first resistor and the second trimmed second resistor has a first target resistance value.

16. The reprocessing method of claim 15, wherein a sum of the resistance value of the first trimmed first resistor and a resistance value of the second resistor before it is trimmed has a second target resistance value.

17. A reprocessing method of a semiconductor device, comprising:
    laser trimming a thin film resistor included in an embedded printed circuit board;
    determining that the laser trimmed resistor does not have a target resistance value; and
    printing a thick film resistor on the laser trimmed resistor to obtain the target resistance value.

18. The reprocessing method of claim 17, wherein the thick film resistor includes carbon paste.

* * * * *